United States Patent
Hermanowski et al.

(10) Patent No.: US 11,627,674 B2
(45) Date of Patent: Apr. 11, 2023

(54) EXPLOSION-PROOF HOUSING HAVING INTERNAL PRESSURE REDUCTION

(71) Applicant: R. Stahl Schaltgeräte GmbH, Waldenburg (DE)

(72) Inventors: Clife Hermanowski, Seckach (DE); Thorsten Arnhold, Pfedelbach (DE); Bernd Limbacher, Schwäbisch Hall (DE)

(73) Assignee: R. Stahl Schaltgerate GMBH, Waldenburg (DE)

( * ) Notice: Subject to any disclaimer, the term of this patent is extended or adjusted under 35 U.S.C. 154(b) by 633 days.

(21) Appl. No.: 16/617,921

(22) PCT Filed: Mar. 22, 2018

(86) PCT No.: PCT/EP2018/057338
§ 371 (c)(1),
(2) Date: Nov. 27, 2019

(87) PCT Pub. No.: WO2018/219517
PCT Pub. Date: Dec. 6, 2018

(65) Prior Publication Data
US 2020/0113076 A1    Apr. 9, 2020

(30) Foreign Application Priority Data
Jun. 1, 2017    (DE) .................. 10 2017 112 150.1

(51) Int. Cl.
*H05K 5/02*    (2006.01)
*H01H 9/04*    (2006.01)

(52) U.S. Cl.
CPC .......... *H05K 5/0217* (2013.01); *H01H 9/042* (2013.01); *H05K 5/0209* (2022.08)

(58) Field of Classification Search
CPC .......................... H05K 5/0217; H01H 9/042
USPC ........................................................ 220/88.2
See application file for complete search history.

(56) References Cited

U.S. PATENT DOCUMENTS

| | | | |
|---|---|---|---|
| 4,180,177 A | 12/1979 | Gunderman et al. | |
| 5,000,336 A | * 3/1991 | Gass | ...... F17C 13/123 220/88.1 |
| 5,500,037 A | * 3/1996 | Alhamad | ...... B31D 5/0065 96/108 |
| 8,578,866 B2 | 11/2013 | Lüling | |
| 11,252,830 B2 | * 2/2022 | Arnhold | ............ H02B 1/28 |

(Continued)

FOREIGN PATENT DOCUMENTS

| | | |
|---|---|---|
| CN | 102985153 A | 3/2013 |
| CN | 103260710 A | 8/2013 |

(Continued)

OTHER PUBLICATIONS

Russian Office Action dated Sep. 1, 2021.

*Primary Examiner* — J. Gregory Pickett
*Assistant Examiner* — Niki M Eloshway
(74) *Attorney, Agent, or Firm* — Blank Rome LLP

(57) ABSTRACT

A housing with an inner lining, made of an open-pore material, preferably covering at least two sides of the housing, for the reduction of internal explosion pressure. In addition, or alternatively, a molded body made of the open-pore material, for example a bonded fibrous material, may be arranged in the housing.

11 Claims, 2 Drawing Sheets

(56) References Cited

U.S. PATENT DOCUMENTS

| | | | | |
|---|---|---|---|---|
| 2006/0139853 | A1* | 6/2006 | Daoud | H01H 9/042 |
| | | | | 361/600 |
| 2015/0060445 | A1* | 3/2015 | Mann | A62C 3/16 |
| | | | | 29/451 |
| 2015/0286250 | A1 | 10/2015 | Sailer | |
| 2020/0062487 | A1* | 2/2020 | Gehlhausen | F17C 3/04 |
| 2020/0113071 | A1* | 4/2020 | Arnhold | H05K 5/0217 |
| 2020/0113075 | A1* | 4/2020 | Arnhold | H02B 1/28 |
| 2021/0289642 | A1* | 9/2021 | Arnhold | H02B 1/28 |
| 2022/0132692 | A1* | 4/2022 | Kondrus | H05K 7/2039 |

FOREIGN PATENT DOCUMENTS

| | | |
|---|---|---|
| CN | 104427813 A | 3/2015 |
| DE | 261 063 A3 | 10/1988 |
| DE | 4313776 C1 | 10/1994 |
| DE | 102 45 307 A1 | 4/2004 |
| DE | 198 60 383 B4 | 6/2005 |
| DE | 20 2008 000 808 U1 | 8/2008 |
| DE | 10 2005 042 565 B4 | 8/2009 |
| DE | 10 2009 025 296 A1 | 12/2010 |
| DE | 10 2013 204 585 A1 | 9/2014 |
| DE | 10 2013 006 738 A1 | 10/2014 |
| DE | 10 2013 109 259 A1 | 3/2015 |
| DE | 10 2014 206 433 B3 | 8/2015 |
| DE | 10 2014 206 436 B3 | 8/2015 |
| DE | 20 2016 000 506 U1 | 6/2016 |
| DE | 10 2015 206 355 A1 | 10/2016 |
| DE | 20 2015 005 015 U1 | 11/2016 |
| DE | 10 2010 016 782 B4 | 12/2016 |
| EP | 1 369 628 B1 | 9/2005 |
| RU | 2009137959 | 4/2011 |
| RU | 2448228 C2 | 4/2012 |

* cited by examiner

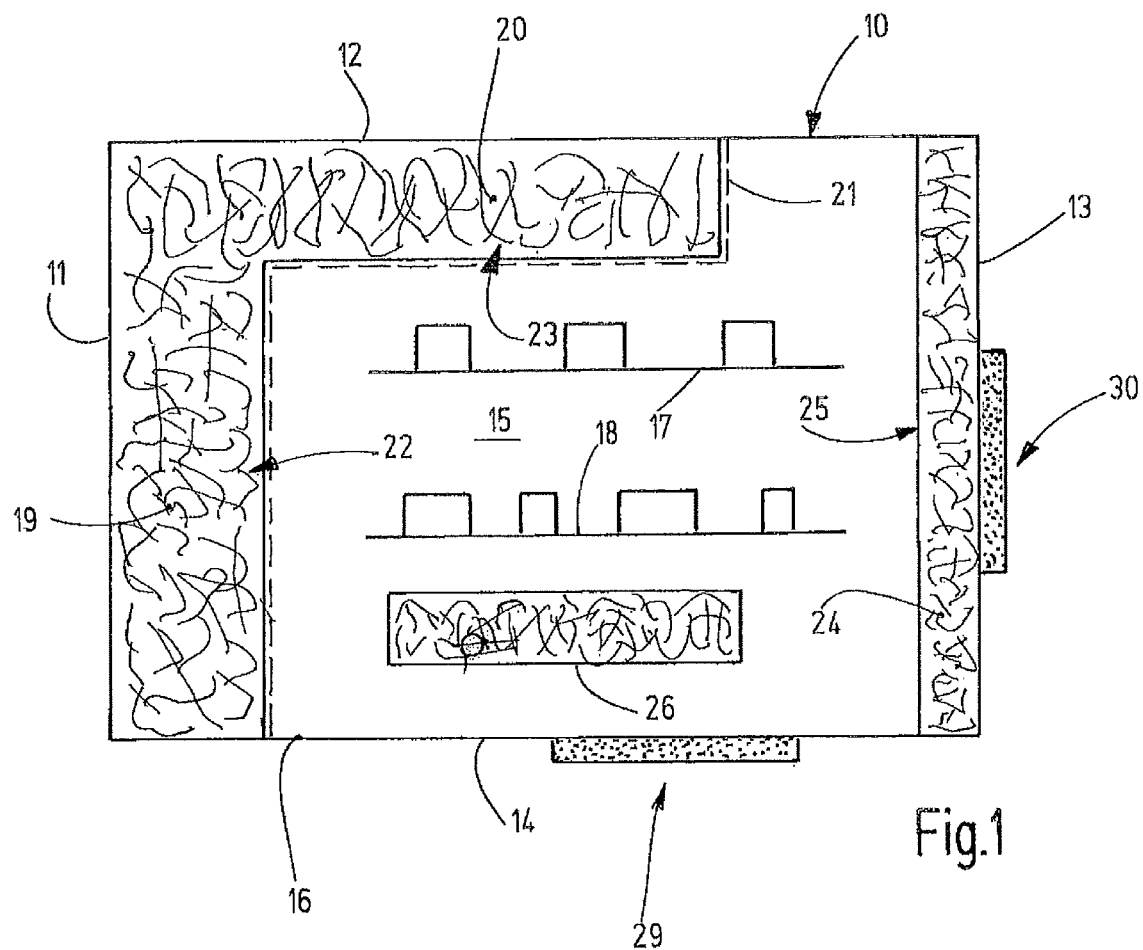
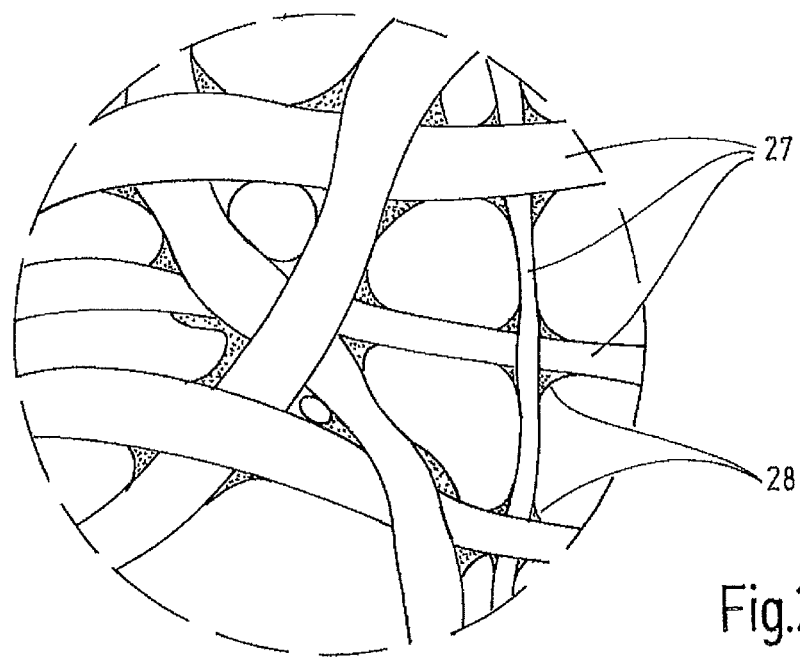

EXPLOSION-PROOF HOUSING HAVING INTERNAL PRESSURE REDUCTION

CROSS-REFERENCE TO RELATED APPLICATIONS

This is a national stage of International Application No. PCT/EP2018/057338 filed Mar. 22, 2018 which claims priority to German Patent Application No. 10 2017 112 150.1, filed Jun. 1, 2017, the entirety of all of which are incorporated by reference herein.

TECHNICAL FIELD

The subject matter of the invention relates to an explosion-proof housing, in particular to a single-chamber or multi-chamber housing consistent with protection "flame proof class Ex-d".

BACKGROUND

Housings consistent with the protection class Ex-d are frequently used in explosive areas. Such housings are robust in that they withstand an ignition of an explosive gas mixture occurring in its interior space, as well as the pressure increase caused by the subsequently occurring explosion. Furthermore, the housings are designed in such a manner that flames or burning particles acting as ignition sources cannot get to the outside. Should there be gaps, they must have a minimum length and must not exceed a maximum width. Existing housing vents are provided with pressure relief bodies which are also referred to as flame protection filters and prevent a flame ignited in the housing from escaping to the outside, in which case such flame protection filters also effect a pressure compensation relative to the environment.

Publication DD 261063 A3 describes an explosion-proof housing with a porous body arranged in its interior space, said porous body, for example, consisting of slag wool, glass wool, metal or ceramic with open through-pores or through-gaps. Such a body arranged in the housing is intended to lower the explosion pressure by approximately 90%.

Publication DE 198 60 286 B4 discloses a housing intended for a display screen that has an interior space which is partially filled with a porous damping material in order to lower the explosion pressure. The material has a plurality of channels in the form of pores or gaps, which channels have a small cross-section and are not closed but are continuous. As a result of this, the explosion pressure is to be reduced to only approximately 10 percent of the explosion pressure which would otherwise occur in the empty housing.

Furthermore, publication DE 10 2014 206433 B3 suggests the arrangement of a tablet computer in an explosion-proof housing provided with a glass pane, in which case a damping element of open-pore rock wool, quartz wool, glass wool, metal foam and the like is arranged in the tablet computer.

Some of the known housings with bodies of open-pore material represent special solutions which are relatively space-consuming and/or are highly adapted for specific situations such as, for example, tablet computers.

In contrast, publication DE 10 2013 109 259 A1 describes an explosion-proof housing of the protection class consistent with pressure-proof encapsulation (Ex-d); in this case, there is provided, in the housing wall of said housing, a porous pressure relief body through which an explosion pressure built up in the housing can escape toward the outside. This principle is also applied by the housings according to publication U.S. Pat. No. 4,180,177, as well as publication DE 10 2010 016 782 B4.

Pressure relief bodies of this type—when such housings are arranged in a contrary environment of contamination or when they are affected by weather conditions—are subject to bacterial contamination, icing and/or corrosion. If these conditions are taken into consideration, expenses are increased.

SUMMARY

It is the object of the invention to state a concept for an explosion-proof housing that can be used in many ways and is less expensive and/or elaborate.

This object is achieved with the housing arrangement according to claim 1, as well as with the housing arrangement according to claim 9.

The housing according to the invention comprises a wall arrangement with several walls that enclose an interior space. On at least two of the walls of the wall arrangement, there is provided an open-pore material. Due to this arrangement of the open-pore material on two different walls—for example, walls that are opposite each other or are at an angle with respect to each other—a pressure wave triggered in the housing is destroyed particularly effectively. This applies in the case, in which each of the walls provided with the open-pore material is covered over its entire surface with this material, as well as in the case, in which one or several of the walls are covered with the material, said material extending only over part of the area of the affected wall.

The use of at least two or more wall surfaces for the application of open-pore material that dampens a pressure wave impacting or traveling along said material results in a large active damping surface and thus in a high damping effect, even if only relatively thin layers of open-pore material are used. Consequently, the portion of the interior space of the housing available for the accommodation of components is only minimally reduced by the open-pore material. The walls in the housing may be lined partially or completely with porous material. One the one hand, the porous materials act as a non-ignitable relief volume and, on the other hand, as an extinguishing volume for an entering flame front. A spherical explosion front is absorbed immediately as quickly as possible by the lining over a large area, in which case a cooling and absorption of the uncombusted gasses is effected. In doing so, the amount of the gas participating in the combustion or explosion is reduced, on the one hand, and the pressure is reduced due to gas cooling, on the other hand. By completely lining the housing on the inside with the open-pore material, an optimal surface/volume ratio is attained for the housing.

Due to the arrangement of the open-pore material, preferably on the walls only, it is possible to attain a large cohesive installation space for operating materials, switches and the like.

Preferably, the open-pore material is arranged in direct, intimate contact with the at least two walls. The heat transfer existing between the open-pore material and the housing wall due to this cools the open-pore material, so that said open-pore material features a high pressure-reducing effect. The housing wall forms a heat storage which is in thermal communication with the open-pore material.

The open-pore material can be connected to the walls of the pressure-proof housing in a material-bonded manner, covering the entire surface or only parts thereof. To do so, the porous material is welded to the walls or, if the housing is produced by a casting process, connected to the housing walls by being cast in the casting mold by forming. Other mechanical positive and/or material bonded connecting possibilities can be utilized. For example, the open-pore material may be surrounded by a grid structure which is connected to the wall arrangement. The grid structure may be a wire mesh, a perforated plate, a plastic screen or the like.

Preferably, the porous material is configured as a plate or mat having an essentially uniform thickness, so that the surface facing away from the wall is arranged so as to be parallel to the wall or extend at an acute angle with respect to the wall. In doing so, there are at least two surfaces of the open-pore material located essentially opposite each other or at an angle with respect to each other. Both result in an effective damping of a dynamically passing through flame front.

Pressure relief bodies may be arranged at locations of the wall which are free of open-pore material or locations of the wall which are covered by the open-pore material. Whereas the open-pore material itself does not offer or need to offer any safety feature in view the transmission of flame, the safety of flame transmission toward the outside is provided by the pressure relief body or bodies. The open-pore material is mainly adapted to cool gas and thus absorb thermal energy and minimize pressure peaks. In view of the gas flow, the heat absorption arrangement and the flame arrester formed by the open-pore material are arranged in sequence. By combining the material, which does not feature safety of flame transmission-arresting properties, with a flame arrester, a pressure relief featuring improved effectiveness is provided. This applies independently of whether the open-pore material is provided only on the inside of a single housing wall or on several housing walls.

In a preferred embodiment, however, the pressure relief body and thus an external pressure equalization may be dispensed with, in that the open-pore material applied to the inside of the walls leads to a rapid cooling and thus to quite a considerable pressure reduction. The open-pore material may be formed by one or more bodies of metal foam, sintered metal particles, metal fibers, metal wires, metal strips, mineral fibers such as glass fibers, rock wool fibers, quarts fibers and the like. The open-pore material may have a grid structure, a mesh structure or a fabric structure and, in particular, may be formed of several superimposed layers of the grid, mesh or fabric structure. These layers may be loosely placed on top of each other or, e.g., be connected to each other by sintering or by another technique. The bodies of wire material or fiber material may be needle felted arrangements, i.e., randomly oriented, fiber assemblies with felted fibers which are, however, not bonded to each other. If needed, there may also exist a material bond of the fibers among each other, e.g., by means of a binding agent or by sintering. These fibers result in a cooling of the absorbed pressure wave due to heat absorption and in a destruction of the kinetic energy of the pressure wave due to the internal friction of the fibers against each other. Preferred is a material that displays a high heat storage capacity such as rock wool or ceramic wool.

***The fiber material of the open-pore material may be pre-pressed to form a body having the shape of plates, parallel epipeds or other shapes, which can be placed, glued or screwed into the housing or which are held by a frame. The compression of the fiber body, however, is preferably weak enough that any distances and gaps of the porous materials are located—in at least some locations—above the gap width limit of traditional explosion protection, i.e., cooling effect, flow effect or other kinetic effects, which could prevent an ignition of gas present in the material or prevent a movement of the flame front through the material, do not or not continuously exist. In particular, when the open-pore material has a high heat capacity as is the case, for example, in glass fibers, quartz fibers, ceramic fibers, rock fibers, a high pressure reduction is achieved nevertheless.

The open-pore material may also be bonded by inorganic or organic binding agents to such an extent that an open-pore dimensionally stable body is formed. This body need not necessarily adjoin the wall. Such a preformed, bonded fiber body can be arranged in the housing on four, five or six sides. Said body also acts—without wall connection—in a pressure-reducing manner and can be used alternatively or additionally to the lining of the housing with open-pore material as described hereinabove. Likewise, the shape of the open-pore material arranged on the housing wall can be stabilized by an organic or inorganic binding agent.

BRIEF DESCRIPTION OF THE DRAWINGS

Exemplary embodiments of the invention can be inferred from the description, the claims and the drawings. They show in FIG. 1 a schematic representation of a housing according to the invention with various measures for pressure reduction;

FIG. 2 a detail of a pressure-reducing, open-pore body of the housing as in FIG. 1;

DETAILED DESCRIPTION

Figure 3:
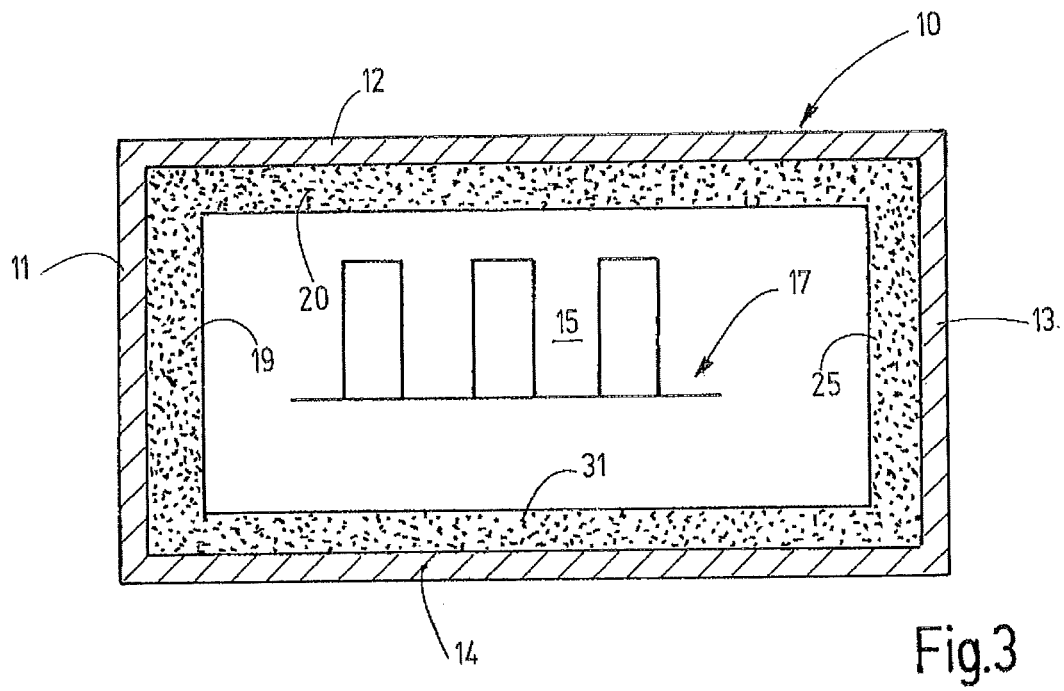
FIGS. 3 and 4 schematic cross-sectional representations of further embodiments of the housing according to the invention.

FIG. 1 shows an explosion-proof housing 10 that comprises several walls 11, 12, 13, 14 which delimit an interior space 15 which is closed toward the outside. Together with a not specifically shown bottom and a cover, the walls 11 to 14 form a wall arrangement 16. The bottom and the cover of this housing may be connected permanently or also removably to the walls 11 to 14. Furthermore, they are also considered walls.

In the interior space 15 there may be arranged structural elements and components such as, for example, printed circuit boards 17, 18 that have electrical components arranged on them, which printed circuit boards can act as ignition sources.

On at least two walls 11, 12 of the housing 10, there is arranged an open-pore material 19, 20, for example in the form of plates, bodies or mats, which cover the respective wall 11, 12, either in full or in part. The open-pore material may comprise fibers or particles in movable form in bonded-together form. The latter may have regularly or irregularly formed and arranged pores. For example, these may be grid structures comprising one or more superimposed grids of metal wires, ropes or strips that are arranged in a grid form or as a fabric. The metal wires, ropes or strips are connected to each other and lie loosely, for example in layers, on top of each other. The metal wires, metal strips or wires may also be formed to represent another knit product such as, for example, a knit or mesh product. The wires, ropes or strips may also consist of another heat-absorbing material.

In doing so, the open-pore material is preferably arranged abutting against the respective wall 11, 12 and, further preferably, connected thereto. The connection may take place by full-area gluing, welding or by other connecting measures which result in a material-bonded connection of partial or complete areas. Alternatively or additionally, the open-pore material 19, 20 may be held in a receptacle which is formed, for example, by a grid structure 21. The grid structure 21 may be a housing of perforated metal sheets, a wire grid, a cage or the like, which is connected to the housing 10 and keeps the open-pore material 19, 20 away from the remaining interior space 15.

The open-pore material 19, 20 has—on its side facing the interior space 15—surfaces 22, 23 which, as illustrated, are arranged at an angle relative to each other, said angle being smaller than 180°.

As an alternative or an addition to the open-pore material 20, there is arranged, opposite the open-pore material 19, another section 24 of open-pore material. It may be the same open-pore material or an open-pore material other than the open-pore materials 19, 20. It may have the same or a different thickness. Likewise, the open-pore materials 19, 20 may have the same or different thicknesses. The material 24 has a surface 25 facing the interior space 15, which surface 25 is opposite the surface 22 and is arranged at an angle of, e.g., 90° relative to the surface 23.

The open-pore material 19, 20 and/or 24 forms an internal pressure relief device. Another internal pressure relief device may be formed by the open-pore body 26 which is arranged in the interior space 15 of the housing 10, freely abutting against at least four, preferably against five or six, sides, i.e., not abutting against one of the walls of the wall arrangement. The explanations regarding the body 26 hereinafter optionally also apply to the open-pore material 19, 20.

The open-pore body 26 is preferably a fiber body whose fibers are connected to each other by means of a binding agent. FIG. 2 illustrates schematically a detail of the body 26. As is obvious, several fibers 27 are intertwined in a spatially disordered manner and connected by a binding agent 28. The fibers may be metal fibers or mineral fibers, in particular glass fibers, quartz fibers, rock fibers, ceramic fibers. The binding agent 28 may be a synthetic resin, in particular a phenol resin. The resin proportion is small enough, so that pores existing between the fibers 27 remain open. However, it is large enough that the open-pore body 26 displays considerable dimensional stability, so that said body—in the event of an explosion in the interior space 15—is not dissolved and does not release any—or at best a harmless—quantity of fibers.

Alternatively, the fibers, wires, filaments or particles of which the body 26 consists, can also be arranged regularly and still be connected to each other by a binding agent. The fibers 27 may be the same fibers which are also used for the open-pore material 19, 20, 24. The latter may also be subjected to preliminary compacting and, if desired, also be provided with the binding agent.

Optionally, the housing 10 may be provided with at least one pressure relief device 29 and/or 30, which allows a flow communication between the interior space of the housing and the environment. Both pressure relief devices 29, 30 are porous gas-permeable bodies with a gap width and a gap length that prevent a flame transmission. The pressure relief device 29 is arranged in a section of the wall 14 of the housing 10 that is free of porous material. The additionally or alternatively provided pressure relief device 30—viewed from the direction of the interior space 15—is covered by the open-pore material 25. However, this does not prevent the penetration of gas. This combination of heat-absorbing open-pore—however not flame-arresting—material 25 and the pressure relief device 30 can be used independently of the open-pore material 19, 20.

FIG. 3 shows a modified embodiment of the housing 10 according to the invention. The description hereinabove applies analogously with the use of the already introduced reference signs. Different from the housing 10 described hereinabove, the housing 10 according to FIG. 3 has porous material 19, 20, 25, 31 on all four walls 11, 12, 13, 14 of the housing and, optionally additionally, on the not illustrated bottom and/or on the cover. The open-pore material 19, 20, 25, 31 forms a layer extending along the walls with local interruptions or also continuously, which layer catches a flame front ignited in the interior space 15 and absorbs the resultant pressure wave.

Figure 4:
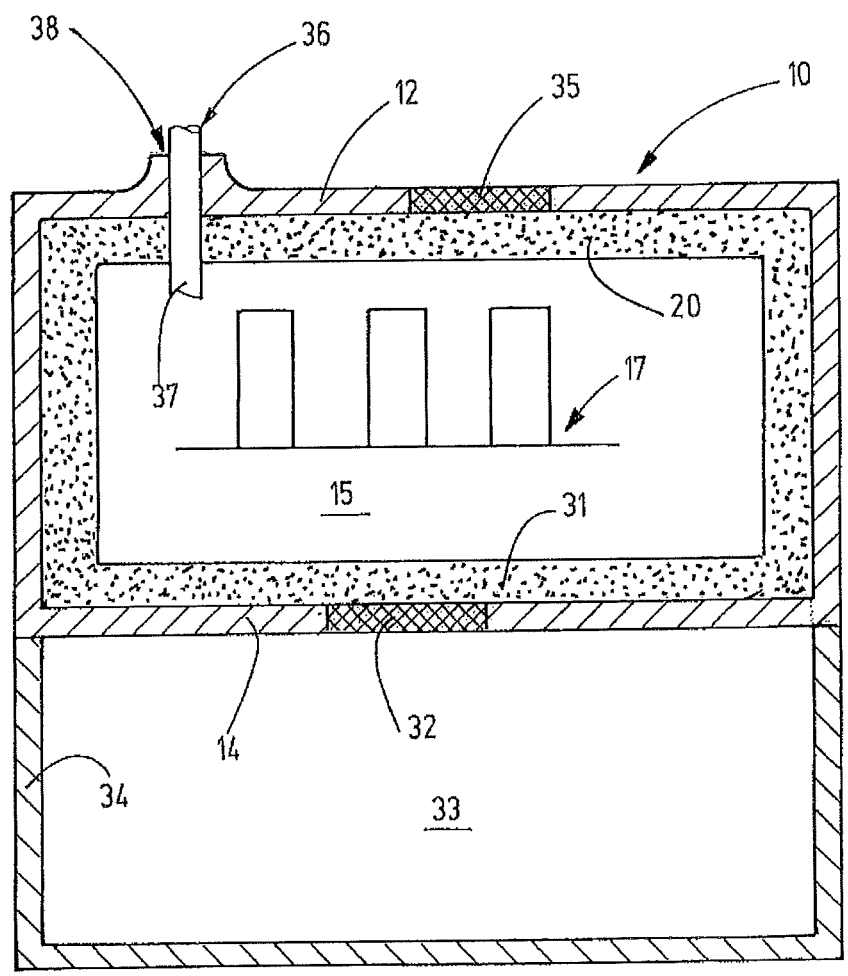

The housing 10 illustrated by FIG. 4 represents an embodiment based on the housing 10 according to FIG. 3. Optionally, this housing comprises a pressure relief device 32 that is configured so as to be flame-arresting and arranged in the wall 14 which adjoins an expansion volume 33. This expansion volume can be separated from the environment by a partial housing 34 and be closed relative to the environment or also have openings via which it communicates with the environment.

Additionally or alternatively, a pressure relief body 35 may be provided in the wall 12, which pressure relief body allows a pressure relief toward the environment. The flame-arresting pressure relief body 35, in turn, may be covered or not covered on the inside by the porous material 20. Furthermore, a passage arrangement 36 may be provided, in which, for example, a shaft 37 is passed through the housing wall 12. To do so, the shaft 37 and the housing wall 12 can define a gap 38 which is resistant to ignition transmission. The shaft 37 can be passed through the open-pore material 20 and transmit movements between elements outside the housing 10 to elements inside the housing 10.

The housing 10 according to the invention can be provided on the inside with a lining made of an open-pore material covering at least two sides of the housing 10, for the reduction of internal explosion pressure. Additionally or alternatively, a molded body made of the open-pore material, in particular a bonded fiber material, can be arranged in the housing.

| Reference Signs: | |
|---|---|
| 10 | Housing |
| 11-14 | Walls |
| 15 | Interior space |
| 16 | Wall arrangement |
| 17, 18 | Printed circuit boards |
| 19, 20 | Open-pore material |
| 21 | Grid structure |
| 22, 23 | Surfaces of the open-pore material |
| 24 | Section of the open-pore material |
| 25 | Surface |
| 26 | Open-pore body |
| 27 | Fibers |
| 28 | Binding agent |
| 29, 30 | Pressure relief device |
| 31 | Open-pore material |
| 32 | Pressure relief body |
| 33 | Expansion volume |
| 34 | Partial housing |
| 35 | Pressure relief body |

The invention claimed is:

1. A housing consistent with protection class ex-d, the housing comprising:
   a wall arrangement comprising at least a first wall and a second wall that encloses an interior space, wherein each of the first wall and second wall comprises;

a pressure relief body having first and second surfaces respectively proximal and distal to the interior space and the pressure relief body comprises a porous, gas-permeable material sufficient to prevent a flame in the housing from escaping the interior space;

an open-pore material extending from the interior space to the pressure relief body, the open-pore material sufficient to absorb a pressure wave from a source increasing pressure within the interior space; and wherein at least one of the open-pore materials covers and extends beyond a first surface of one of the pressure relief bodies.

2. The housing according to claim 1, wherein the open-pore material is arranged so as to be directly abutting against the at least two walls.

3. The housing according to claim 1, wherein the open-pore material includes first and second faces, said first face is proximal to said interior space and said second face distal to said interior space.

4. The housing according to claim 3, wherein the second face of the open-pore material is parallel to at least one of the at least two walls.

5. The housing according to claim 1, wherein the open-pore material is a fiber material.

6. The housing according to claim 1, wherein the open-pore material is bordered by a grid structure connected to the wall arrangement.

7. The housing according to claim 1, wherein a region of the at least two walls supports the open-pore material and is configured so as to be closed or comprises only flame-arresting gaps.

8. The housing according to claim 1, wherein the open-pore body comprises a metal or mineral filament arrangement which is bonded by a binding agent so as to be dimensionally stable.

9. The housing according to claim 8, wherein the filament arrangement comprises metal wires, metal ropes, metal strips, metal fibers, glass fibers, quartz fibers, rock fibers, ceramic fibers or a mixture thereof.

10. The housing according to claim 8, wherein the binding agent is a synthetic resin.

11. The housing according to claim 8, wherein the binding agent is an inorganic binder.

* * * * *